United States Patent [19]

Cherian

[11] Patent Number: 5,357,326
[45] Date of Patent: Oct. 18, 1994

[54] HIGH QUALITY COLOR HIGHLIGHT PRINTS USING B/W XEROGRAPHY

[75] Inventor: Abraham Cherian, Webster, N.Y.

[73] Assignee: Xerox Corporation, Stamford, Conn.

[21] Appl. No.: 95,643

[22] Filed: Jul. 21, 1993

[51] Int. Cl.$^5$ .................... G03G 8/00; G03G 15/14
[52] U.S. Cl. .................... 355/278; 156/277; 355/279; 430/47
[58] Field of Search ............... 355/32, 77, 200, 202, 355/271, 277, 278, 279, 282, 285, 290, 326, 327; 219/216; 156/277, 290, 292, 580, 327; 430/47, 126, 44, 104

[56] References Cited

U.S. PATENT DOCUMENTS

| | | | |
|---|---|---|---|
| 3,813,267 | 5/1974 | Honjo et al. | 156/327 X |
| 3,914,097 | 10/1975 | Wurl | 432/59 |
| 4,066,802 | 1/1978 | Clemens | 427/24 |
| 4,178,096 | 12/1979 | Lontz | 355/32 |
| 4,470,861 | 9/1984 | Kravig et al. | 156/277 X |
| 4,600,669 | 7/1986 | Ng et al. | 430/47 |
| 4,686,163 | 8/1987 | Ng et al. | 430/47 |
| 4,724,026 | 2/1988 | Nelson | 156/233 |
| 4,868,049 | 9/1989 | Nelson | 428/328 |
| 4,949,103 | 8/1990 | Schmidlin et al. | 346/150 |
| 5,065,183 | 11/1991 | Morofuji et al. | 355/202 |
| 5,108,865 | 4/1992 | Zwaldo et al. | 430/126 |
| 5,126,797 | 6/1992 | Forest et al. | 355/278 |

FOREIGN PATENT DOCUMENTS 60-234873 11/1985 Japan .................... 355/202

*Primary Examiner*—William J. Royer

[57] ABSTRACT

Simulated photographic prints are created using xerographic imaging. A transparent carrier having a xerographically formed mirror image fused thereto is bonded to a plastic substrate through the use of heat and pressure. The transparent carrier and the plastic substrate form the finished print.

16 Claims, 3 Drawing Sheets

HIGH QUALITY COLOR HIGHLIGHT PRINTS USING B/W XEROGRAPHY

BACKGROUND OF THE INVENTION

This invention relates generally to a method and apparatus for producing continuous tone images with near photographic print qualities using xerography.

In the practice of conventional xerography, it is the general procedure to form electrostatic latent images on a xerographic surface by first uniformly charging a charge retentive surface such as a photoreceptor. The charged area is selectively dissipated in accordance with a pattern of activating radiation corresponding to original images. The selective dissipation of the charge leaves a latent charge pattern on the imaging surface corresponding to the areas not exposed by radiation.

This charge pattern is made visible by developing it with toner by passing the photoreceptor past one or more developer housings. In monochromatic imaging, the toner is generally comprises black thermoplastic powder particles which adhere to the charge pattern by electrostatic attraction. The developed image is then fixed to the imaging surface or is transferred to a receiving substrate such as plain paper to which it is fixed by suitable fusing techniques.

Recently, there has been a great deal of effort directed to the development of color copiers/printers which utilize the xerographic process. Such efforts have resulted in the recent introduction of the Xerox TM 5775 TM copier/printer and the Fuji Xerox A-Color 635 machine.

The quality of color xerographic images on paper has approached the quality of color photographic prints. However, color xerographic prints fall short because they do not have the uniform gloss, dynamic range or brilliance typical of photographic prints. Nor do xerographic prints have the feel of photographic prints because the paper usually used is too lightweight and too limp.

Typically the surface of color toner images is irregular, therefore, rather rough or lumpy. The behavior of incident white light vis-a-vis such color images is believed to be as follows:

Some of the white light incident on the substrate carrying the color toner images specularly reflects off the substrate.

Some of the light goes down into the paper, scatters around and comes back out in various directions, some through the toner and some not.

Because the toner surface is rough or irregular some of the light incident thereon is reflected off the toner in various directions.

Some of the light incident on the irregular toner surfaces passes through the toner into the paper and comes back out in various directions.

White light becomes colored due to selective absorption as it passes through toner. The light then goes down into the paper and back out through the toner whereby it becomes more colored. As will be appreciated, any white light which does not pass through the toner diminishes the appearance of the final print.

Attempts to make up this deficiency in conventionally formed color toner images have led to the lamination of xerographic images on paper using a transparent substrate. This procedure has been only partially successful because the lamination process tends to reduce the density range of the print resulting in a print that has less shadow detail. The lamination process also adds significant weight and thickness to the print.

Additionally, it is believed that the aforementioned lamination process does not produce good results because typically the color toner images at the interface between the laminate and the toner do not make suitable optical contact. That is to say, the initially irregular toner image at the interface, is still irregular (i.e. contains voids) enough after lamination that light is reflected from at least some of those surfaces and is precluded from passing through the toner. In other words, when there are voids between the transparency and toner image, light gets scattered and reflected back without passing through the colored toner. Loss of image contrast results when any white light is scattered, either from the bottom surface of the transparent substrate or from the irregular toner surfaces and doesn't pass through the toner.

A known method of improving the gloss of color xerographic images on a transparent substrate comprises refusing the color images. Such a process was observed at a NOMDA trade show in 1985 at a Panasonic exhibit. The process exhibited was carried out using an off-line transparency fuser, available from Panasonic as model FA-F100, in connection with a color printer which was utilized for creating multicolor toner images on a transparent substrate for the purpose of producing colored slides. Since the finished image from the color printer was not really suitable for projection, it was refused using the aforementioned off-line refuser. To implement the process, the transparency was placed in a holder intermediate a clear relatively thin sheet of plastic and a more sturdy support. The holder is used for transporting the imaged transparency through the off-line refuser. After passing out of the refuser, the transparency is removed from the holder. This process resulted in an attractive high gloss image useful in image projectors. The refuser was also used during the exhibit for refusing color images on paper. However, the gloss is image-dependent. Thus, the gloss is high in areas of high toner density because the toner refuses in contact with the clear plastic sheet and becomes very smooth. In areas where there is little or no toner the gloss is only that of the substrate.

The following is a discussion of prior art which may be relevant to the patentability of the present invention:

U.S. Patent Nos. 4,686,163 and 4,600,669 describe an electrophotographic imaging method that uses an element comprising a photoconductive layer on an electrically conducting substrate capable of transmitting actinic radiation to which the photoconductive layer is responsive, and a dielectric support, releasably adhered to the substrate, comprising the photoconductive layer or an overcoat thereof forming a surface of the element capable of holding an applied electrostatic charge. To use the element, the surface of the dielectric support is charged, and the photoconductive layer is imagewise-exposed to actinic radiation, thereby forming a developable electrostatic image on the dielectric surface. The electrostatic image, in turn, is developed with toner to form a first color image. A composite color image is formed on the element by repeating the sequence one or more times with imagewise exposure of the photoconductive layer to actinic radiation transmitted through the substrate, and developing over each preceding image with a different color toner. The composite toner image is transferred with the dielectric support to a receiving element to form a color copy such as a three-color filter array or a color proof closely simulating the color print expected from a full press run.

The dielectric support on the photoconductive layer comprised a transparent blend of poly(vinylacetate-co-crotonic acid, 95/5 mole ratio) and cellulose acetate butyrate. The resulting multicolor proof presented a multicolor toner image against a white paper background and protected by the overlying dielectric support, thus accurately resembling a multicolor print from a full press run.

The receiver element to which the dielectric support and composite toner image are transferred can be any suitable material against or through which the toner image is desired to be viewed. The receiver can be print stock, such as paper, upon which a press run will be conducted. The receiver can also be of transparent material such as a polymeric film. With respect to the latter, the invention also contemplates, as an embodiment, transfer of the composite toner image and dielectric support to image-bearing elements such as microfilm or microfiche so that the composite color image forms information in addition to image information already present on such image-bearing elements. In addition, the invention contemplates the use of transparent glass or nonbirefringent translucent polymeric materials such as cellulose esters for use as the receiver. Receivers manufactured from such materials are suited for use in forming three-color filter arrays by the process described herein involving the formation of filter array matrices of the complementary colorants cyan, magenta and yellow in the respective color toner imaging steps. If desirable, the receiver can also contain a suitable overcoat layer adapted to soften under the influence of pressure and heat during the transfer step. In this manner, the adhesion of the dielectric support and composite toner image to the receiver can be enhanced.

The electrophotographic element bearing the multicolor toner image is moved to a separate lamination device comprising heated metal and rubber rolls, together forming a nip. The toner image is passed through the nip with and against a white receiver paper at a roll temperature of 100° C. (212° F.) and a pressure of 225 pounds per square inch (1.551 MPa) to effect transfer of the dielectric support and composite image to the receiver followed by peeling off the rest of the electrophotographic element.

U.S. Pat. No. 4,066,802 granted on Jan. 3, 1978 to Carl F. Clemens discloses a method of decalcomania in which a toner image pattern is formed on a transfer member which has been overcoated with an abhesive material. A polymeric sheet is interposed between the toner image and a cloth or other image receiving medium. The polymeric sheet assists in the permanent adherence of the toner imaging pattern to the cloth material or other medium when the composite is subjected to heat and pressure. The transfer member and method of its use are set forth. Another embodiment discloses the use of solvent to fix the image to a cloth material.

U.S. Pat. No. 5,065,183 granted on Nov. 12, 1991 to Morofuji et al discloses a multicolor printing method for printing multicolor picture images upon a material or object to be printed comprises the steps of, in accordance with a first embodiment of the invention, the formation of a multicolor toner image upon a flexible belt by means of electrophotographic printing methods or techniques, and the transfer of such multicolor toner image directly to the material or object to be printed, such as, for example, a container made of, for example, metal, paper, plastic, glass, or the like, by means of a thermo-transferring process. In accordance with a second embodiment of the invention, the multicolor toner image is formed upon a plastic film, which is laminated upon the flexible belt, by means of electrophotographic printing methods or techniques, and the plastic film is then transferred to and fused upon the container. In accordance with a third embodiment of the invention, a photoconductive member is irradiated by means of exposure light upon a rear surface thereof wherein the multicolor picture images are also formed by electrophotographic printing methods or techniques. In this manner, previously formed toner images upon the photoconductive member do not interfere with the image exposure processing.

U.S. Pat. No. 5,126,797 granted on Jun. 30, 1992 to Forest et al discloses a method and apparatus for laminating toner images wherein a toner image on a receiving sheet is laminated using a transparent laminating sheet fed from the normal copy sheet supply of a copier, printer or the like. The laminating sheet is fed into laminating contact with the toner image after the toner image has been formed on a receiving sheet. The resulting sandwich is fed through the fuser laminating the image between the sheets. The invention is particularly usable in forming color transparencies.

U.S. Pat. No. 5,108,865 granted to Zwaldo et al on Apr. 28, 1992 discloses a method including the steps of:
contacting an image (preferably multi-toned image) with a transfer web (intermediate receptor layer) comprising in sequence, a carrier layer, a transferable release layer, and a releasable adhesive layer (releasable from the carrier layer along with the transferable release layer so that both layers transfer at once), said adhesive layer being in contact with said toned image, said contacting being done under sufficient heat and/or pressure to enable said toned image to be adhered to said releasable adhesive layer with greater strength than the adherence of said toned image to said imaging surface of said photoconductive layer;
separating the transfer web and said photoconductive layer so that the toned image is removed from said photoconductive layer and remains adhered to the adhesive layer of the transfer web;
contacting the surface of the transfer web having both the multi-toned image and adhesive thereon with a permanent receptor surface;
adhering the adhesive on the transfer web to the permanent surface; and
removing the carrier layer of the transfer web from the adhesive and the release layer of the transfer web so that an image article is formed of the permanent receptor, multi-toned image, releasable adhesive, and the resultant surface coating of the release layer which is furthest away from the permanent receptor.

U.S. Pat. No. 4,949,103 granted to Schmidlin et al on Aug. 14, 1990 discloses a direct electrostatic printing (DEP) device utilized for printing mirror or reverse/wrong reading toner images on a transparent substrate. An adhesive coating on the transparent substrate on the toner image side thereof enables the transparent substrate to be affixed to a substrate such as an envelope such that the mirror images are right reading.

U.S. Pat. Nos. 4,868,049 and 4,724,026 granted to Marshall A. Nelson on Feb. 9, 1988 and Sep. 19, 1989, respectively disclose selective metallic transfer foils for selectively transferring metallic foil to xerographic images on a receiving substrate such as paper. The transfer sheet comprises, in successive layers, a carrier film, a metallic film and an adhesive, the adhesive containing a dispersion of 0.5 micron or larger particulate material. A method is disclosed for forming images overlaid with metallic foil. According to the method of the invention, a sheet comprising xerographic images is provided and placed in face-to-face contact with a metal transfer sheet, to form a sandwich with the xerographic images on the inside. Heat and pressure are applied to the sandwich, causing the xerographic images to become tacky and causing the metallic foil to selectively adhere to the images. The remainder of the transfer sheet is then stripped away from the resulting decorated sheet comprising xerographic images overlaid with metallic foil.

In the preferred embodiment of the invention, the metal transfer sheet is provided with an adhesive of high filler content resin which has been found to produce good quality transfers to xerographic images produced by a wide variety of toners and photocopy machinery.

U.S. Pat. No. 3,914,097 granted to Donald R. Wurl on Oct. 21, 1975 discloses a sheet guide and cooling apparatus for preventing curl in sheets bearing a developed image, the image being permanently fixed to the sheet by application of heat and pressure. The apparatus is positioned to have a flat thermally conductive surface establishing a path for the sheet, downstream of the fixing area, the path extending in a plane substantially coplanar with the plane of sheet travel in the fixing station. Vacuum means associated with the surface maintains successive incremental portions of a sheet in face-to-face contact with the flat surface as it is being guided for at least a predetermined period as the sheet moves along the path and furthermore, provides a flow of cooling air for the surface.

U.S. patent application Ser. No. 08/095,639 filed on the same date as the instant application discloses a method and apparatus for creating simulated photographic prints wherein a mirror image is formed on a transparent substrate. The transparent substrate has bonded thereto a backing sheet which serves as protection for the powder images on the transparent substrate as well as a reflective backing which significantly enhances the look of the images. The transparent substrate and backing sheet are bonded together by simultaneously passing the two members between a pair of heated rollers while simultaneously applying pressure.

U.S. patent application Ser. No. 08/095,622 filed on the same date as the instant application discloses a device for creating simulated photographic prints. A transparent substrate to which a reverse reading image has been fused is uniformly coated on the image side thereof with a white material which serves a the reflective backing.

U.S. patent application Ser. No. 08/095,016 filed on the same date as the instant application discloses a device for creating simulated photographic prints. As disclosed therein, a transparent substrate with a reverse reading toner image thereon is bonded to a backing sheet using heat and pressure provided by a pair of heat and pressure roller members. A second pair of rollers are provided downstream of the heat and pressure roll pair and receives the leading edge of a simulated photographic print and serves to pull the print in order to flatten it. A vacuum holddown transport downstream of the puller rolls serves to further flatten the print during a cool-down period.

U.S. patent application Ser. Nos. 08/095,790 and 08/095,136 filed on the same date as the instant application discloses a device for creating simulated photographic prints wherein a transparent carrier having a xerographically formed mirror image fused thereto is bonded to a plastic substrate through the use of heat and pressure. The transparent carrier and the plastic substrate form the finished print.

U.S. patent application Ser. No. 08/095,788 filed on the same date as the instant application discloses a kit for creating simulated photographic prints using xerographic imaging. The kit comprises a transparent carrier suitable for having a reverse reading toner image fused thereto and a reflective backing sheet, the latter of which is coated with a heat activatable adhesive material for bonding the latter to the former. The kit further includes a rigid surface of tempered glass upon which the transparent substrate is supported during bonding. An abhesive member is provided for covering the transparent carrier during the process of making prints.

BRIEF SUMMARY OF THE INVENTION

The primary object of the present invention is to create simulated color photographic prints using black and white xerography wherein the print has the appearance of a conventional color photograph and a degree of flatness not exhibited by simulated prints of the prior art.

Briefly, the present invention is carried out by first creating a black and white, reverse reading (or mirror) toner image on a transparent substrate by the use of heat and pressure or other suitable means to affix or fuse the image to the transparent substrate. The toner carrying side of the transparent substrate is then bonded to a colored (i.e. green, blue or yellow, etc.) substrate to provide colorization to the print.

Satisfactory results have been obtained by placing the transparent substrate containing the toner images, image side up, on a tempered glass member and placing a sheet of colored coated paper material in contact with the toner image carried by the transparent substrate. Each side or surface of the sheet of coated paper material is provided with or serves as a carrier for a uniform coating of adhesive material for bonding the former to the latter. The tempered glass provides a smooth rigid support which rests on an elastomeric pad contained in a lower platen of a print making apparatus. A clear or nonimaged transparent substrate is placed on top of an adhesive layer on the top of the sheet for bonding to that side of the sheet. By bonding the substrate to the backside of the sheet, the sheet is provided with substrates having identical thermal properties as those of the transparent substrate on both sides of the sheet to improve the flatness of a finished print compared to the situation where only the imaged transparent substrate is used in forming the final print.

An abhesive or non-stick member is placed on top of the plastic coated sheet material to provide for easy separation of the finished print from the print making apparatus. The non-stick member comprises a sheet of polyester material having one or both sides thereof coated with an abhesive material such as silicone rubber.

A heated top platen is used to apply pressure and heat to the transparent substrate and the translucent sheet through the abhesive member to thereby effect bonding of the former to the latter. The resulting print exhibits an attractive and brilliant appearance which is more fade resistance and durable than commercially available photographic prints. Prints created in the foregoing manner have the look and feel of photographic prints but appear to have more brilliance. This is thought to be attributable to the xerographically formed prints having a lesser minimum density than conventional photographic prints resulting in whiter whites.

A further aspect of this invention is that exceptionally good quality prints can be more quickly and more cost effectively produced than with conventional photographic printing techniques, especially in the case of larger size prints. Additionally, this process does not require silver, photographic chemicals, or intermediary negatives even when a black and white print is created from a color original.

Existing color xerographic copier/printer systems adapted for black only imaging or a black only imaging system can be used for the process. Thus, all the resources associated with these products, particularly the ones which utilize state of the art electronic devices such as film scanners, image composition enhancers, color adjusters and editors can be utilized.

DETAILED DESCRIPTION OF THE PREFERRED EMBODIMENT OF THE INVENTION

Figure 1:
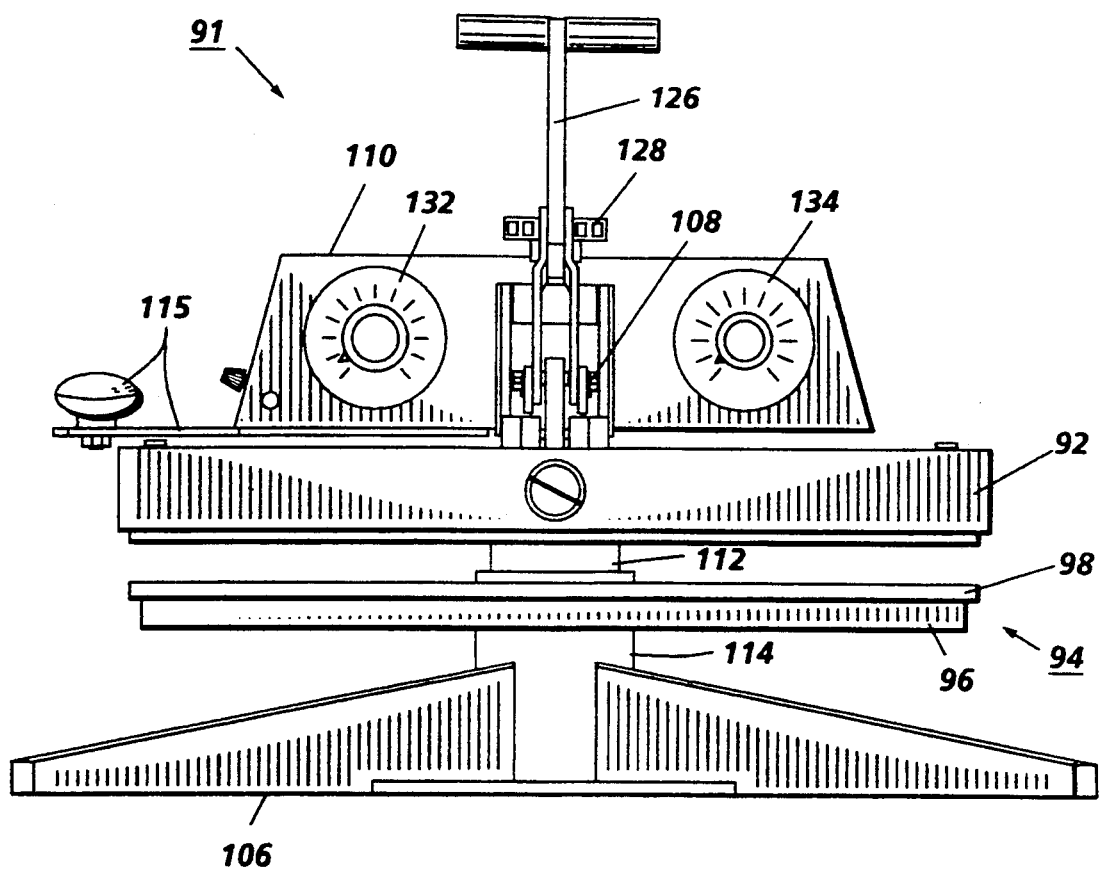
FIG. 1 is a front elevational view of a device for making simulated photographic prints using the principles of xerography.

While the present invention will hereinafter be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

For a general understanding of the features of the present invention, reference is made to the drawings. In the drawings, like references have been used throughout to designate identical elements.

Figure 4:
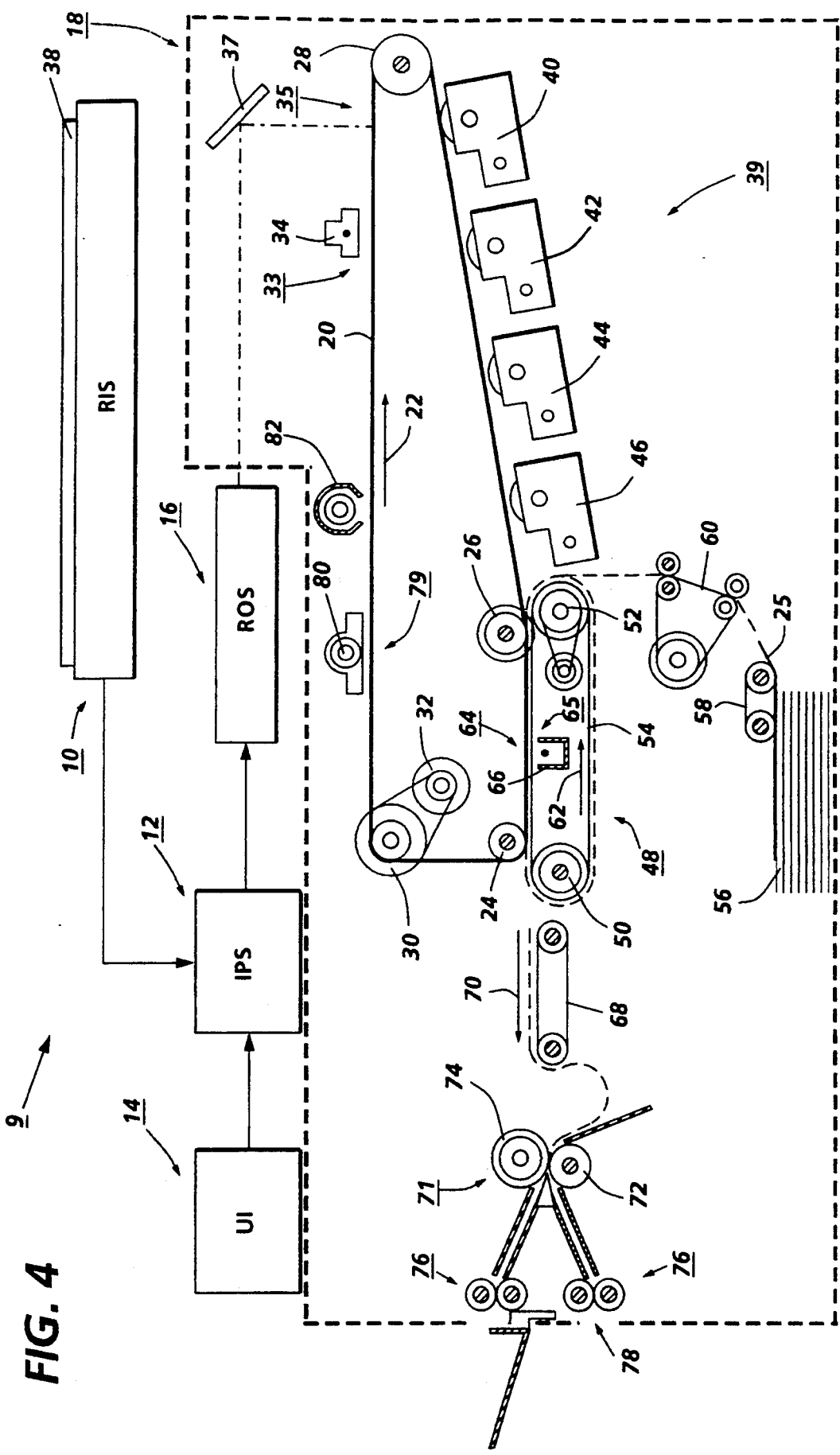
FIG. 4 is a schematic illustration of an imaging apparatus suitable for use in carrying out the present invention.

FIG. 4 is a schematic elevational view of an illustrative electrophotographic copier which may be utilized in carrying out the present invention. It will become evident from the following discussion that the present invention is equally well suited for use in a wide variety of printing systems, and is not necessarily limited in its application to the particular system shown herein.

Turning initially to FIG. 4, during operation of a printing system 9, a multi-color original document or photograph 38 is positioned on a raster input scanner (RIS), indicated generally by the reference numeral 10. The RIS contains document illumination lamps, optics, a mechanical scanning drive, and a charge coupled device (CCD array). The RIS captures the entire original document and converts it to a series of raster scan lines and measures a set of primary color densities, i.e. red, green and blue densities, at each point of the original document. This information is transmitted to an image processing system (IPS), indicated generally by the reference numeral 12. IPS 12 contains control electronics which prepare and manage the image data flow to a raster output scanner (ROS), indicated generally by the reference numeral 16. A user interface (UI), indicated generally by the reference numeral 14, is in communication with IPS 12. UI 14 enables an operator to control the various operator adjustable functions. The output signal from UI 14 is transmitted to IPS 12. Signals corresponding to the desired image are transmitted from IPS 12 to a ROS 16, which creates the output image. ROS 16 lays out the image in a series of horizontal scan lines with each line having a specified number of pixels per inch. ROS 16 includes a laser having a rotating polygon mirror block associated therewith. ROS 16 is utilized for exposing a uniformly charged photoconductive belt 20 of a marking engine, indicated generally by the reference numeral 18, to achieve a set of subtractive primary latent images. The latent images are developed with cyan, magenta, and yellow developer material, respectively. These developed images are transferred to a final substrate in superimposed registration with one another to form a multi-color image on the substrate. This multi-color image is then heat and pressure fused to the substrate thereby forming a multi-color toner image thereon.

The printing system 9 is capable of printing conventional right reading toner images on plain paper or mirror images on various other kinds of substrates as will be discussed hereinafter. Mirror or reverse reading images on final substrates are effected through programed use of the UI 14.

The features of the printing system hereinabove described are utilized in the commercially available 5775 TM copier.

With continued reference to FIG. 4, printer or marking engine 18 is an electrophotographic printing machine. Photoconductive belt 20 of marking engine 18 is preferably made from a polychromatic photoconductive material. The photoconductive belt moves in the direction of arrow 22 to advance successive portions of the photoconductive surface sequentially through the various processing stations disposed about the path of movement thereof. Photoconductive belt 20 is entrained about transfer rollers 24 and 26, tensioning roller 28, and drive roller 30. Drive roller 30 is rotated by a motor 32 coupled thereto by suitable means such as a belt drive. As roller 30 rotates, it advances belt 20 in the direction of arrow 22.

Initially, a portion of photoconductive belt 20 passes through a charging station, indicated generally by the reference numeral 33. At charging station 33, a corona generating device 34 charges photoconductive belt 20 to a relatively high, substantially uniform electrostatic potential.

Next, the charged photoconductive surface is moved through an exposure station, indicated generally by the reference numeral 35. Exposure station 35 receives a modulated light beam corresponding to information derived by RIS 10 having a multi-color original document 38 positioned thereat. RIS 10 captures the entire image from the original document 38 and converts it to a series of raster scan lines which are transmitted as electrical signals to IPS 12. The electrical signals from RIS 10 correspond to the red, green and blue densities at each point in the original document. IPS 12 converts the set of red, green and blue density signals, i.e. the set of signals corresponding to the primary color densities of original document 38, to a set of colorimetric coordinates. The operator actuates the appropriate keys of UI 14 to adjust the parameters of the copy. UI 14 may be a touch screen, or any other suitable control panel, providing an operator interface with the system. The output signals from UI 14 are transmitted to IPS 12. The IPS then transmits signals corresponding to the desired image to ROS 16. ROS 16 includes a laser with a rotating polygon mirror block. Preferably, a nine facet polygon is used. ROS 16 illuminates, via mirror 37, the charged portion of photoconductive belt 20 at a rate of about 400 pixels per inch. The ROS will expose the photoconductive belt to record three latent images. One latent image is developed with cyan developer material. Another latent image is developed with magenta developer material and the third latent image is developed with yellow developer material. The latent images formed by ROS 16 on the photoconductive belt correspond to the signals transmitted from IPS 12.

According to the present invention, the document 38 preferably comprises a black and white or color photographic print. It will be appreciated that various other documents may be employed without departing from the scope and true spirit of the invention.

After the electrostatic latent images have been recorded on photoconductive belt 20, the belt advances such latent images to a development station, indicated generally by the reference numeral 39. The development station includes four individual developer units indicated by reference numerals 40, 42, 44 and 46. The developer units are of a type generally referred to in the art as "magnetic brush development units." Typically, a magnetic brush development system employs a magnetizable developer material including magnetic carrier granules having toner particles adhering triboelectrically thereto. The developer material is continually brought through a directional flux field to form a brush of developer material. The developer material is constantly moving so as to continually provide the brush with fresh developer material. Development is achieved by bringing the brush of developer material into contact with the photoconductive surface. Developer units 40, 42, and 44, respectively, apply toner particles of a specific color which corresponds to a compliment of the specific color separated electrostatic latent image recorded on the photoconductive surface. The color of each of the toner particles is adapted to absorb light within a preselected spectral region of the electromagnetic wave spectrum. For example, an electrostatic latent image formed by discharging the portions of charge on the photoconductive belt corresponding to the green regions of the original document will record the red and blue portions as areas of relatively high charge density on photoconductive belt 20, while the green areas will be reduced to a voltage level ineffective for development. The charged areas are then made visible by having developer unit 40 apply green absorbing (magenta) toner particles onto the electrostatic latent image recorded on photoconductive belt 20. Similarly, a blue separation is developed by developer unit 42 with blue absorbing (yellow) toner particles, while the red separation is developed by developer unit 44 with red absorbing (cyan) toner particles. Developer unit 46 contains black toner particles and may be used to develop the electrostatic latent image formed from a black and white original document. Each of the developer units is moved into and out of an operative position. In the operative position, the magnetic brush is closely adjacent the photoconductive belt, while in the non-operative position, the magnetic brush is spaced therefrom. In FIG. 4, developer unit 40 is shown in the operative position with developer units 42, 44 and 46 being in the non-operative position. During development of each electrostatic latent image, only one developer unit is in the operative position, the remaining developer units are in the non-operative position. This ensures that each electrostatic latent image is developed with toner particles of the appropriate color without commingling.

It will be appreciated by those skilled in the art that scavengeless or non-interactive development systems well known in the art could be used in lieu of magnetic brush developer structures. The use of noninteractive developer systems for all but the first developer housing would make it unnecessary for movement of the developer housings relative to the photoconductive imaging surface.

Figure 3:
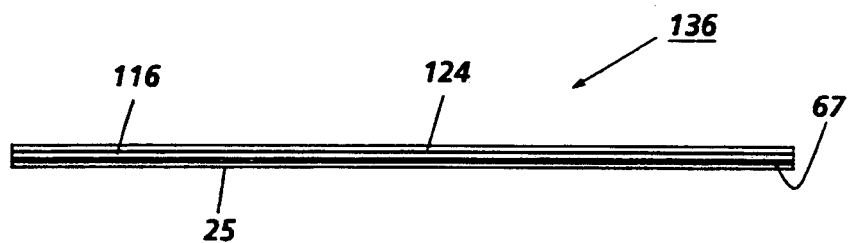
FIG. 3 is a enlarged plan view of a simulated photographic print created according to the present invention.

After development, the toner image is moved to a transfer station, indicated generally by the reference numeral 65. Transfer station 65 includes a transfer zone, generally indicated by reference numeral 64. In transfer zone 64, the toner image is transferred to a transparent substrate 25. At transfer station 65, a substrate transport apparatus, indicated generally by the reference numeral 48, moves the substrate 25 into contact with photoconductive belt 20. Substrate transport 48 has a pair of spaced belts 54 entrained about a pair of substantially cylindrical rollers 50 and 52. A substrate gripper (not shown) extends between belts 54 and moves in unison therewith. The substrate 25 is advanced from a stack of substrates 56 disposed on a tray. A friction retard feeder 58 advances the uppermost substrate from stack 56 onto a pre-transfer transport 60. Transport 60 advances substrate 25 to substrate transport 48. Substrate 25 is advanced by transport 60 in synchronism with the movement of substrate gripper, not shown. In this way, the leading edge of substrate 25 arrives at a preselected position, i.e. a loading zone, to be received by the open substrate gripper. The substrate gripper then closes securing substrate 25 thereto for movement therewith in a recirculating path. The leading edge of substrate 25 is secured releasably by the substrate gripper. As belts 54 move in the direction of arrow 62, the substrate moves into contact with the photoconductive belt, in synchronism with the toner image developed thereon. At transfer zone 64, a corona generating device 66 sprays ions onto the backside of the substrate so as to charge the substrate to the proper electrostatic voltage magnitude and polarity for attracting the toner image from photoconductive belt 20 thereto. The substrate remains secured to the substrate gripper so as to move in a recirculating path for three cycles. In this way, three different color toner images are transferred to the substrate in superimposed registration with one another to form a composite multi-color image 67, FIG. 3. According to the invention, the composite toner image formed on the photoconductive belt 20 is a right reading image so that after transfer thereof, to a transparent substrate in a manner to be described hereinafter, the image represents a wrong or reverse reading multi-color toner image when viewed from the toner side and is right reading when viewed through the transparent substrate.

The transparent substrate 25 preferably comprises transparent polyester material such as Mylar, commercially available from E. I. DuPont. A suitable thickness for the transparent substrate for use in forming simulated photographic prints using the xerographic process described above is approximately 0.0042 inch. The actual thickness of the transparent substrate will depend on the xerographic processor which is used for making the color images on the transparent substrate. An important characteristic of the substrate 25 is that its glass transition temperature is substantially above that of the toner materials employed in creating the images thereon.

One skilled in the art will appreciate that the substrate may move in a recirculating path for four cycles when under color removal and black generation is used and up to eight cycles when the information on two original documents is being merged onto a single substrate. Each of the electrostatic latent images recorded on the photoconductive surface is developed with the appropriately colored toner and transferred, in superimposed registration with one another, to the substrate to form a multi-color facsimile of the colored original document.

An important feature of the above described copier is its capability of producing black only images which feature is used in the carrying out present invention After the last transfer operation, the substrate gripper opens and releases the substrate 25. A conveyor 68 transports the substrate, in the direction of arrow 70, to a heat and pressure fusing station, indicated generally by the reference numeral 71, where the transferred toner image is permanently fused to the substrate. The fusing station includes a heated fuser roll 74 and a pressure roll 72. The substrate passes through the nip defined by fuser roll 74 and pressure roll 72. The toner image contacts fuser roll 74 so as to be affixed to the transparent substrate. Thereafter, the substrate is advanced by a pair of rolls 76 to an outlet opening 78 through which substrate 25 is conveyed to a processor to be discussed hereinafter.

The last processing station in the direction of movement of belt 20, as indicated by arrow 22, is a cleaning station, indicated generally by the reference numeral 79. A rotatably mounted fibrous brush 80 is positioned in the cleaning station and maintained in contact with photoconductive belt 20 to remove residual toner particles remaining after the transfer operation. Thereafter, lamp 82 illuminates photoconductive belt 20 to remove any residual charge remaining thereon prior to the start of the next successive cycle.

A process according to the invention for forming a simulated photographic print which uses the transparency 25 containing the composite, reverse reading color image 67 will now be described.

A print creation apparatus 91 (FIGS. 1-3) including upper and lower platen structures 92 and 94, respectively, is provided for producing simulated photographic prints using xerography. The lower platen comprises a rigid metal plate or base member 96 containing a silicone rubber pad 98 having a thickness of approximately 0.5 inch. A flat rigid member supported on the silicone rubber pad comprises a ⅜ inch thick, smooth-surfaced, tempered glass member 100. The smooth-surfaced tempered glass serves to smooth any wrinkles created in the transparency material during the imaging process. The upper platen 92 contains a heater structure 102 (FIG. 2) including heating elements 104.

The plate or base member 96 is provided with a leg structure 106 for supporting the the print making structure 91 on a suitable work surface such as a table. The upper platen 92 is hingedly secured via hinge structure 108 to an upper platen support structure 110. The support structure 110 is, in turn, operatively supported by a post member 112 received in a cylindrically shaped receiver member 114 forming an integral part of the plate or base member 96. The support structure is adapted to be pivoted relative to the base member 96 through the use of an arm and knob arrangement 115 attached to the support structure 110. The upper heated platen can thus be rotated from its home position overlying the tempered glass member 100 in order to provide easy access thereto for inserting the materials used for print creation.

In the process of forming a simulated photographic print according to the present invention, the transparency 25 containing the toner images is placed, image side up, on the tempered glass 100 and a colored (i.e. green, blue or yellow, etc.) translucent sheet member 116 comprising a coated paper material is placed in contact with the toner image on the transparent substrate 25.

Each side or surface of the sheet 116 is coated with and thereby serves as a carrier for a uniform coating of adhesive material 118 which is applied to a thickness of about 0.00025 inch. A number of adhesives can be selected for use in the present invention including materials that will enable the layers to substantially permanently bond to each other and not easily separate after extended time periods, such as for up to 1 year. Examples of suitable adhesives include polyesters, such as those available from Goodyear Chemical and E. I. Du Pont, polyvinylacetate, phenolics, epoxy resins, certain polyacrylates polycyanoacrylates, cellulosic esters. These adhesives are selected in various effective amounts such as for example from about 1 to about 75 weight percent and preferably from about 0.1 to about 25 weight percent. The adhesive layer thickness is generally from about 0.1 micron to about 25 microns, and preferably from about 1 to about 10 microns or more in embodiments, however other effective thickness may be selected. An aerosol or spray adhesive has been used with satisfactory results. Specifically, a commercially available adhesive sold by the 3M Co. under the name of SUPER 77 has been used. The aforementioned adhesive is provided in a spray can dispenser and, therefore, it can be easily applied to the sheet 116. SUPER 77 spray adhesive is a high tack, high coverage material and a fast drying composition that is heat activated at about 225° F.

Another suitable adhesive available from the 3M company and is designated as 556 Bonding Film. This bonding film comprises 40 to 50% by weight of polyterpene resin, 30 to 40% by weight of ethylent-vinyl acetate polymer, 10 to 20% by weight of polyethylene and 1 to 10% by weight of thermoplastic polymer. A layer of this bonding film may be applied directly to the sheets 116 or it may be transferred thereto using a carrier sheet containing the bonding film as provided by the manufacturer. In the case of the latter method, the sheet 116 and the film carrier are simultaneously heated while contacting each other for effecting transfer of the bonding film to the backing sheet 116.

A clear or nonimaged transparent substrate 124 is placed on top of the adhesive layer 122 on the top of the sheet 116 for bonding to that side of the sheet 116. By bonding the substrate 124 to the backside of the sheet 116, it is provided with substrates having identical properties as those of the transparent substrate 25 on both sides of the sheet to improve the flatness of a finished print compared to the situation where only the imaged transparent substrate is use in the final print.

An abhesive or non-stick member 120 (FIG. 2) is placed on top of the plastic coated sheet member 116. The member 120 comprises a sheet or film of polyester or Mylar, commercially available from E. I. DuPont which sheet has at least one of its sides coated with an abhesive layer 122 of silicone rubber. For sake of convenient use, both sides of the member 116 can be provided with a layer 122. Thus, with both sides of the polyester film coated with silicone rubber, either side thereof can contact the sheet member 116. The film has a thickness of approximately 0.004 inch while each silicone layer has a thickness of approximately 5 to 10 microns.

A suitable coated paper 116 is disclosed in U.S. Pat. No. 5,075,153. As disclosed therein, the coated paper comprises a plastic supporting substrate such as polyester rather than natural cellulose, with certain coatings thereover. Mylar, commercially available from E. I. DuPont is preferred as the substrate for the coated sheet 116 in view of its availability and lower cost. The coated sheet 116 has a thickness of about 0.004 inch.

The hinge mechanism 108 is located centrally of the upper platen 92 and serves to allow movement of the upper platen 92 relative to the support structure 110, such movement being toward the lower platen 94 for exerting pressure on the print forming members supported on the tempered glass member 100. Movement of the upper platen is effected through the use of a lever arm 126 adapted to be moved in the counterclockwise direction as viewed in FIG. 1.

Pressure variation or adjustment is effected through a pressure adjusting knob 128 and suitable linkage, not shown. The adjustment of the knob through its associated linkage mechanism serves to control the amount of pressure exerted between the upper and lower platens when the lever lever arm 126 is actuated.

Figure 2:
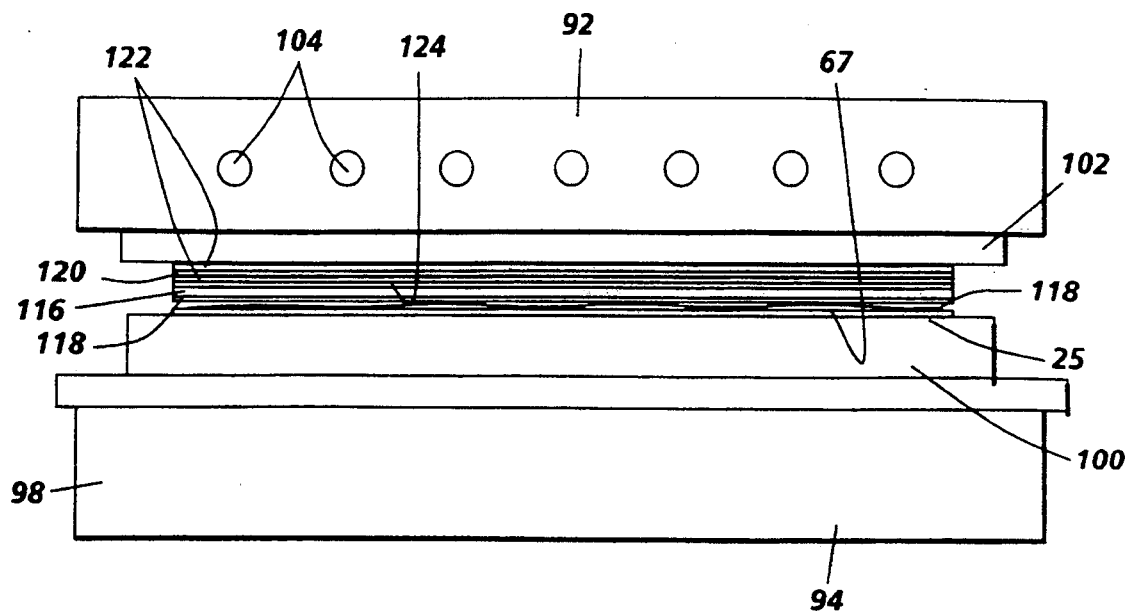
FIG. 2 is a schematic illustration of a device and materials for making a simulated photographic print using the principles of xerography.

An electric cord, not shown, provides electrical current to the heating elements 104. The heating elements and thus the operating temperature of the print creation structure 91 is controlled via a temperature control 132 carried by the support structure 110 as shown in FIG. 1. The operating temperature of the device is in the range of 220° to 250° F. The pressure and heat are applied for between 15 to 20 seconds, the time being settable via a timer control knob 134.

During formation of a simulated photographic print, the transparent substrate and coated paper members are subjected to a total pressure in the order of 5 to 10 pounds over the entire area of 8.5×11 and 11×17 inch print forming members. Since the translucent backing of the print is colored, the finished print exhibits that color. As will be appreciated since the final print comprises the translucent backing member and the transparent front member, the print may be illuminated from the rear with very pleasing results. The resulting simulated photographic print has a total thickness of approximately 0.009 inch. Thus, a print 136 created according to the present invention has a thickness approximately equal to a conventional photograph which is approximately 0.009 inch.

The transparent substrate 25 without toner images thereon, coated paper 116, tempered glass 100 and abhesive or non-stick member 120 form a kit which can be used for creating simulated photographic prints. To this end, the transparent substrate 25 may be used in a machine like the 5775 TM or any other suitable xerographic processor for forming either a black and white or color reverse reading image thereon. A commercially available heat and pressure device can then be used to adhere a sheet of coated paper to the image side of the transparent substrate. A heat and pressure device contemplated for making simulated photographic prints using the aforementioned kit is currently used for applying decals (decal applicator) onto shirts and other articles of clothing. In carrying out the invention, once the image is formed on the transparent substrate and with the tempered glass member supported on the elastomeric base of the heat and pressure applying device, the transparent substrate and coated sheet are placed on top of the tempered glass. The abhesive member is placed on top of the coated sheet. Heat and pressure are then applied in a manner consistent with the normal operation of the decal applicator.

While creation of simulated photographic prints has been disclosed in connection with one specific apparatus it will be appreciated that other apparatuses my be utilized for this purpose. For example, the transparent substrate and backing sheet may be bonded together using a pair of heat and pressure rolls forming a nip through which the substrate and sheet are passed.

What is claim is:

1. Method of forming a simulated photographic print, said method including the steps of:
   xerographically forming a wrong reading toner image on one side of a transparent substrate;
   contacting said toner image with one side of a colored backing member;
   contacting another side of said colored backing member with an abhesive member;
   contacting a non-image side of said transparent substrate with a flat rigid surface;
   simultaneously applying heat and pressure at predetermined values to said transparent substrate, said abhesive member and said colored backing member whereby said substrate and said backing member adhere to each other to form said simulated photographic print;
   separating said abhesive member from said another side of said colored backing member; and
   separating said simulated photographic print from said flat rigid surface.

2. The method of claim 1 wherein said step of simultaneously applying heat and pressure comprises positioning said substrate, backing member, abhesive member and flat rigid surface between a pair of platens at least one of which is provided with a source of heat energy capable of elevating the temperature of said substrate and said colored backing member.

3. The method of claim 2 wherein said step of simultaneously applying heat and pressure is effected by applying a force to one of said platens in order to urge it in the direction of the other of said platens.

4. The method according to claim 2 wherein said backing member has a coating of adhesive material on the side thereof which contacts the toner image.

5. The method according to claim 4 wherein said abhesive member comprises a polyester film having a silicone rubber coating on at least one side thereof.

6. The method according to claim 5 wherein said abhesive member comprises a polyester film having a silicone rubber coating on each side thereof.

7. The method according to claim 6 wherein the thicknesses of said simulated photographic print is approximately equal to 0.009 inch.

8. The method according to claim 7 wherein said flat rigid surface comprises tempered glass.

9. Method of forming a simulated photographic print, said method including the steps of:
   contacting a wrong reading toner image on one side of a transparent substrate with one side of a colored backing member;
   contacting another side of said colored backing member with an abhesive member;
   contacting a non-image side of said transparent substrate with a flat rigid surface;
   simultaneously applying heat and pressure at predetermined values to said substrate, said abhesive member and said colored backing member whereby said substrate and said colored backing member adhere to each other to form said simulated photographic print;
   separating said abhesive member from said colored backing member; and
   separating said simulated photographic print from said flat rigid surface.

10. The method according to claim 9 wherein said step of simultaneously applying heat and pressure comprises positioning said substrate, backing member, abhesive member and flat rigid surface between a pair of platens at least one of which is provided with a source of heat energy capable of elevating the temperature of said substrate and said colored backing member.

11. The method according to claim 10 wherein said step of simultaneously applying heat and pressure is effected by applying a force to one of said platens in order to urge it in the direction of the other of said platens.

12. The method according to claim 11 wherein said backing member has a coating of adhesive material on the side thereof which contacts the toner image.

13. The method according to claim 12 wherein said abhesive member comprises a polyester film having a silicone rubber coating on at least one side thereof.

14. The method according to claim 13 wherein said abhesive member comprises a polyester film having a silicone rubber coating on each side thereof.

15. The method according to claim 14 wherein the thicknesses of said simulated photographic print is approximately equal to 0.009 inch.

16. The method according to claim 15 wherein said flat rigid surface comprises tempered glass.

* * * * *